(12) United States Patent
Andreas

(10) Patent No.: US 6,265,781 B1
(45) Date of Patent: Jul. 24, 2001

(54) METHODS AND SOLUTIONS FOR CLEANING POLISHED ALUMINUM-CONTAINING LAYERS, METHODS FOR MAKING METALLIZATION STRUCTURES, AND THE STRUCTURES RESULTING FROM THESE METHODS

(75) Inventor: Michael T. Andreas, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/153,053

(22) Filed: Sep. 15, 1998

(30) Foreign Application Priority Data

Oct. 19, 1996 (JP) .................................................. 8-281208

(51) Int. Cl.⁷ ........................ H01L 23/485; H01L 23/482
(52) U.S. Cl. ........................ 257/765; 257/763; 257/773; 257/774
(58) Field of Search ................................. 257/751, 763, 257/765, 773, 774

(56) References Cited

U.S. PATENT DOCUMENTS

| | | | |
|---|---|---|---|
| 4,414,249 | * 11/1983 | Ulion et al. ........................ | 427/248.1 |
| 4,851,300 | * 7/1989 | Przybyszewski ...................... | 428/623 |
| 4,875,987 | * 10/1989 | Wada et al. ...................... | 204/192.15 |
| 5,313,089 | * 5/1994 | Jones, Jr. ............................ | 257/295 |
| 5,498,293 | 3/1996 | Ilardi et al. ................................ | 134/3 |
| 5,572,072 | * 11/1996 | Lee ............................................ | 257/751 |
| 5,662,769 | 9/1997 | Schonauer et al. .................... | 438/633 |
| 5,679,169 | 10/1997 | Gonzales et al. ...................... | 134/1.3 |
| 5,786,637 | * 7/1998 | Tabara .................................... | 257/758 |
| 5,866,031 | * 2/1999 | Carpio et al. ........................ | 252/79.1 |
| 5,932,492 | * 8/1999 | Hahm et al. .......................... | 438/737 |
| 6,088,196 | * 7/2000 | Tadokoro et al. .................... | 360/113 |

FOREIGN PATENT DOCUMENTS 8-281208    10/1996   (JP) .

\* cited by examiner

*Primary Examiner*—Eddie C. Lee
*Assistant Examiner*—Allan R. Wilson
(74) *Attorney, Agent, or Firm*—TraskBritt

(57) ABSTRACT

Methods for making an aluminum-containing metallization structure, methods and solutions for cleaning a polished aluminum-containing layer, and the structures formed by these methods. The methods for making the aluminum-containing metallization structure are practiced by providing a substrate, forming a metal layer with an upper surface containing aluminum over the substrate, polishing the metal layer, and contacting the polished surface of the metal layer with a solution comprising water and at least one corrosion-inhibiting agent. The method for cleaning the polished aluminum-containing layer is practiced by contacting a polished aluminum-containing layer with a solution comprising water and a corrosion-inhibiting agent. In these methods and solutions, the water may be deionized water, the corrosion-inhibiting agent may be citric acid or one of its salts, and the solution may contain additional additives, such as chelating agents, buffers, oxidants, anti-oxidants, and surfactants. These methods and solutions reduce the corrosion caused by DI water used in cleaning polished aluminum-containing layers and maintain a passivative environment which protects the exposed aluminum structures.

14 Claims, 1 Drawing Sheet

US 6,265,781 B1

METHODS AND SOLUTIONS FOR CLEANING POLISHED ALUMINUM-CONTAINING LAYERS, METHODS FOR MAKING METALLIZATION STRUCTURES, AND THE STRUCTURES RESULTING FROM THESE METHODS

BACKGROUND OF THE INVENTION

This invention relates generally to the field of semiconductor design and fabrication. Specifically, the invention relates to methods and solutions for cleaning polished metal layers, methods for fabricating metallization structures, and the structures resulting from these methods.

Abrasive planarization ("AP") techniques, such as chemical-mechanical planarization processes, are frequently used to planarize the surface layers of a wafer during fabrication of integrated circuits (ICs). In AP processes, a wafer is generally pressed against a polishing pad in a slurry solution under controlled chemical, pressure, velocity, and temperature conditions. The slurry solution generally contains abrasive particles that mechanically remove the surface layer and may contain chemical agents which attack the surface layer. The polishing pad is generally a planar pad made from a relatively soft, porous material. After being planarized, the surface layer is cleaned to remove materials introduced during the AP process by the slurry, polishing pad, or wafer.

AP processes are particularly useful for planarizing a metallic surface layer to subsequently form conductive features, such as interlayer connectors and conducting lines. Interlayer connectors may be fabricated by forming holes through a dielectric layer, depositing a metal liner over the dielectric layer and in the holes, depositing a metallic layer over the metal liner, and then planarizing the metallic layer to an endpoint near the upper surface of the dielectric layer. Conducting lines may be created by forming trenches in a substrate, such as a silicon wafer, depositing a metal liner over the substrate and in the trenches, depositing a metallic layer over the metal liner and in the trenches, and then planarizing the metal layer to an end-point near the upper surface of the substrate. In both instances, the metallic layers are often planarized using slurries that contain abrasive particles such as aluminum oxide ($Al_2O_3$) particles.

After the metallic layers are planarized, residual particles from the slurry, polishing pad, or wafer remain on the planarized surface. The residual materials include aluminum oxide particles (also known as alumina) from both the slurry and metallic layer, as well as particles from the dielectric layer. All of these particles cause defects in the planarized surface. Thus, it is necessary to clean these residual particles from the planarized surface. Several methods of post-AP cleaning, such as using hydrofluoric (HF) acid or ammonium hydroxide ($NH_4OH$) solutions, are described in U.S. Pat. Nos. 5,498,293, 5,662,769, and 5,679,169, the disclosures of which are incorporated herein by reference.

One problem with current cleaning processes, at least for planarized aluminum-containing layers, is corrosion of the aluminum surface by the cleaning solution. In current cleaning processes, a wafer containing the planarized aluminum-containing layer is placed in a bath of deionized (DI) water and vibrated with sonic energy to remove loose residual particles from the planarized surface. The DI water unfortunately degrades the exposed aluminum surface by forming a thin native oxide layer and by removing aluminum atoms through diffusion. The corrosion caused by DI water can be "mousebite" corrosion, which degrades the interface between the metal and dielectric layers, and "ESD burnout" corrosion, which degrades specific features of individual devices presumably by galvanic action. The corrosion becomes more apparent at smaller pitches. Such corrosion results in reduced performance of the integrated circuit.

SUMMARY OF THE INVENTION

The present invention includes methods for making an aluminum-containing metallization structure and the metallization structures formed thereby. The methods are practiced by providing a substrate, forming a metal layer with an upper surface containing aluminum over the substrate, polishing the metal layer, and contacting the polished surface of the metal layer with a solution comprising water and at least one corrosion-inhibiting agent. The substrate may be a silicon substrate. The metal layer may be polished by an abrasive planarization process. The corrosion-inhibiting agent may be citric acid or a salt thereof. The solution may contain additional additives, such as chelating agents, buffers, oxidants, anti-oxidants, and surfactants.

The present invention also includes methods for cleaning a polished aluminum-containing layer and the structures formed thereby. The methods are practiced by contacting a polished aluminum-containing layer with a solution comprising water and at least one corrosion-inhibiting agent. The water may be deionized water. The corrosion-inhibiting agent may be citric acid or a salt thereof. The solution may contain additional additives, such as chelating agents, buffers, oxidants, anti-oxidants, and surfactants.

The present invention also includes solutions for cleaning a polished aluminum-containing layer. The solution contains water and at least one corrosion-inhibiting agent. The water may be deionized water. The corrosion-inhibiting agent may be citric acid or a salt thereof. The solution may contain additional additives, such as chelating agents, buffers, oxidants, anti-oxidants, and surfactants.

The present invention reduces corrosion of polished aluminum-containing layers caused by cleaning solutions containing DI water. The present invention also maintains a passivative environment which protects the exposed aluminum structures.

BRIEF DESCRIPTION OF THE DRAWINGS

The present invention is illustrated in part by the following drawings in which.

DETAILED DESCRIPTION OF THE INVENTION

The present invention provides cleaning processes and solutions for removing residual particles remaining after polishing aluminum-containing layers. The cleaning processes are especially useful for cleaning polished surfaces of aluminum features, such as interlayer connectors or conducting lines. In particular, the present invention inhibits the corrosion of the polished aluminum features caused by cleaning solutions containing deionized water.

The following disclosure provides specific details, such as material thicknesses and types, to thoroughly describe the present invention. The skilled artisan, however, would understand that the present invention may be practiced without employing these specific details. Indeed, the present invention can be practiced in conjunction with conventional fabrication techniques in the industry.

The process steps and structures described below do not form a complete process flow for manufacturing IC devices, the remainder of which is known to those of ordinary skill in the art. Accordingly, only the process steps and structures necessary to understand the present invention are described.

Figure 1:
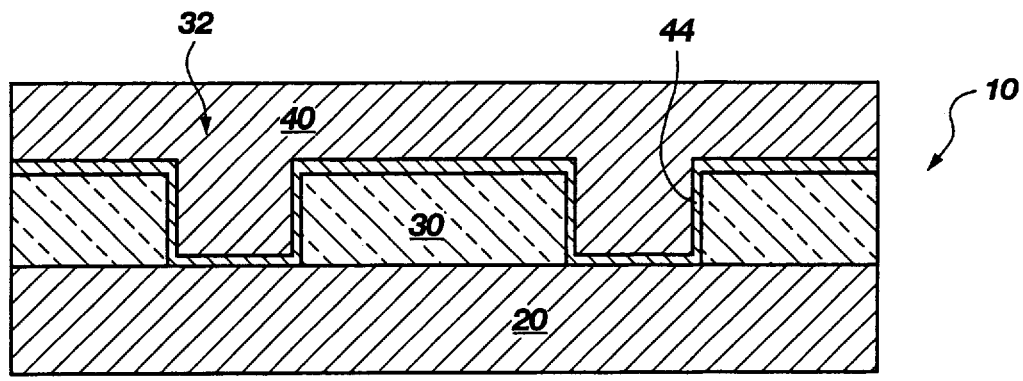
FIG. 1 illustrates a cross-sectional view of an IC device to be planarized.

FIG. 1 illustrates a portion of IC device 10 containing substrate 20, dielectric layer 30 with via 32, metal liner 44, and metal layer 40. Substrate 20 may be any suitable surface in an IC device, such as a metal layer or an active or passive component of an individual device formed from silicon or other semiconducting material. Preferably, substrate 20 is a metal layer, including a metal layer formed over a wafer made of a semiconducting material, such as GaAs, InP, or silicon, or a metal layer formed over a bulk silicon region, such as a silicon-on-insulator or silicon-on-glass structure. The metal layer may comprise any metal known in the art as electrically conductive, such as tungsten, aluminum, copper, or alloys thereof. Preferably, the metal layer is an aluminum/copper alloy containing 0.5% copper.

Dielectric layer 30 may comprise any dielectric material known in the art, such as silicon oxide, silicon nitride, silicon oxynitride, phosphorous and/or boron doped silicate glass, and the like. Dielectric layer 30 may also contain more than one layer of these dielectric materials. Preferably, dielectric layer 30 is a silicon oxide layer deposited using a chemical vapor deposition (CVD) process in an atmosphere containing tetraethylorthosilicate (TEOS).

Metal liner 44 enhances the bonding of overlying metals to substrate 20, reduces stress between overlying metals and substrate 20, and/or acts as a barrier metal layer. Any metal, metal alloy, or metal compound exhibiting such properties can be used in metal liner 44. Appropriate metals include tungsten, aluminum, titanium, or alloys or compounds thereof. Preferably, one or more of the metal layers in metal liner 44 comprise titanium. Metal liner 44 may comprise more than one metal layer. More preferably, metal liner 44 comprises two layers, a layer of titanium underlying a layer of titanium nitride. The thickness of metal liner 44 depends on the physical and chemical properties desired from the liner, as well as the material used. For example, when metal liner 44 comprises a layer of titanium underlying a layer of titanium nitride, the thickness of the underlying titanium layer may range from about 200 to about 400 Å, and is preferably about 300 Å, and the thickness of the titanium nitride layer may range from greater than 0 to about 300 Å, and is preferably about 250 Å.

Metal layer 40 comprises any electrically conductive metal known in the art to act as an interlayer interconnect. Appropriate metals include aluminum, copper or alloys or compounds thereof. Preferably, metal layer 40 comprises aluminum, such as an aluminum alloy containing at least 50 wt % aluminum, as well as silicon and copper. More preferably, metal layer 40 is an aluminum alloy containing 60–100 wt % aluminum, such as an alloy containing 99.5 wt % aluminum and 0.5 wt % copper. The thickness of metal layer 40 depends, inter alia, on the material used and the purpose for which metal layer 40 will be used (e.g., interlayer connect or conducting line). When metal layer 40 comprises aluminum, the thickness can range from about 4000 to about 8000 Å, and is preferably about 6500 Å.

To form the structure illustrated in FIG. 1, substrate 20 is first provided. When substrate 20 comprises a metal layer, it may be formed over the semiconductor wafer or bulk silicon region by any suitable deposition process, such as chemical vapor deposition or sputtering. Dielectric layer 30 is then deposited or otherwise formed on substrate 20 by any suitable process, such as deposition using a CVD process in an atmosphere containing tetraethylorthosilicate (IEOS). Next, at least one hole or via 32 is formed through dielectric layer 30. Via 32 exposes an upper surface of substrate 20 and is formed in a pattern corresponding to the desired location of the interlayer connectors. Via 32 may be formed by any suitable process used in the art which does not degrade substrate 20. Preferably, via 32 is formed by a photolithographic pattern and etch process.

Next, metal liner 44 is optionally deposited over dielectric layer 30 and via 32. Metal liner 44 is preferably formed by any suitable conformal deposition process, such as physical vapor deposition (PVD) or CVD. Where metal liner 44 comprises two layers, the layers are deposited sequentially. Metal layer 40 is then deposited over metal liner 44 so it fills via 32 and overlies metal liner 44 over dielectric layer 30. The portions of metal layer 40 in vias 32 will form interlayer connectors after metal layer 40 is planarized. Metal layer 40 may be formed by any suitable deposition process yielding the desired physical and electrical characteristics, such as CVD or sputtering. Metal layer 40 is preferably deposited by any suitable sputtering process.

Figure 3:
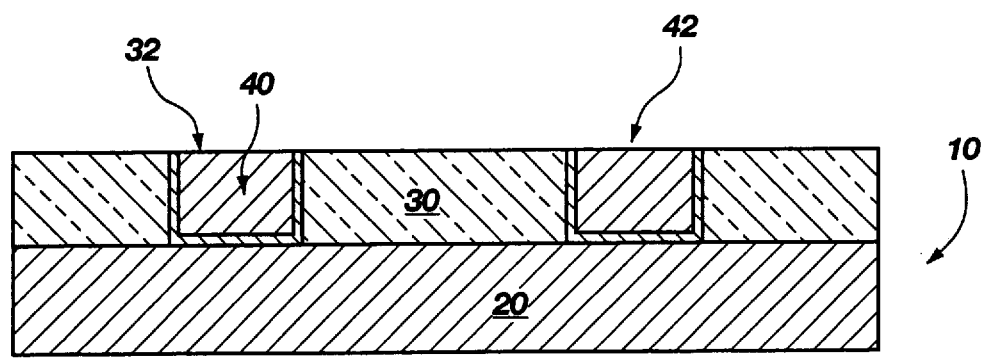
FIG. 3 illustrates a cross-sectional view of a planarized IC device to be cleaned by a method of the present invention.

The structure of FIG. 1 is then planarized. FIG. 3 illustrates the IC device after it has been planarized, preferably by an AP process. AP processes may vary according to the operating requirements of a given machine, such as the polishing pad used and the tooling requirements. AP processes for planarizing metallic layers, including aluminum-containing layers, generally use a slurry containing abrasive particles and at least one oxidant. The oxidant oxidizes the upper surface of the metal layer, which the abrasive particles then polish away. Preferably, the abrasive particle is aluminum oxide. Any of the known oxidants, including those used in abrasive planarization of tungsten such as hydrogen peroxide, potassium iodide, or ammonium persulfate, may be employed in the preferred AP process. A preferred slurry that can be employed in the present invention is an aluminum polishing slurry available from Cabot Corporation.

Metal layer 40 and metal liner 44 are planarized by polishing to an end-point near the upper surface of dielectric layer 30. The planarization may proceed further than this end-point—since the polishing is not selective for aluminum—and thus remove part of the upper surface of dielectric layer 30, but this is not preferred. After metal layer 40 has been planarized, interlayer connectors 42 remain. Interlayer connectors 42 are electrically isolated from one another by the remaining portions of dielectric layer 30.

Figure 2:
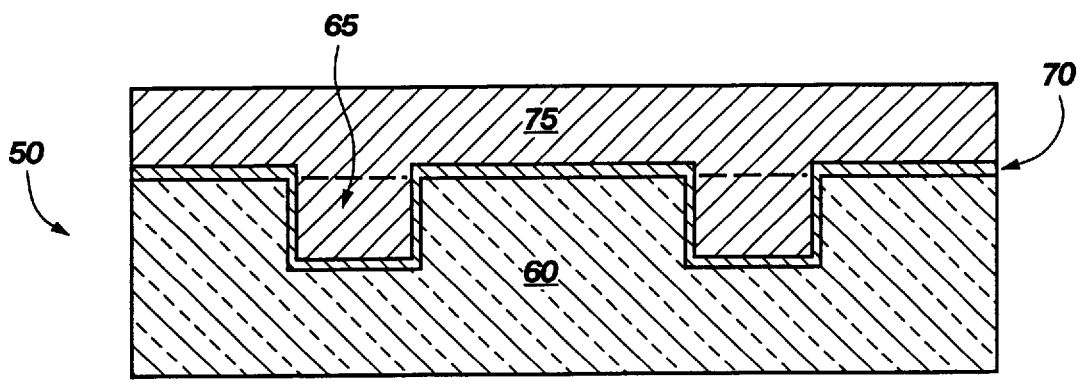
FIG. 2 illustrates a cross-sectional view of another IC device to be planarized.

After planarization, the IC device 10 illustrated in FIG. 3 contains at least one interlayer connector 42. The scope of the present invention, however, is not limited to a specific design and could be employed for any device containing an upper surface of aluminum. Thus, IC device 10 may have many different configurations to which the inventive cleaning process and solutions may be applied. The present invention may also be employed for the device of FIG. 2. The structure depicted in FIG. 2 will form a conducting line after planarization, as shown by the broken line. FIG. 2 depicts a portion of IC device 50 containing substrate 60 with trenches 65, metal liner 70, and metal layer 75.

The planarization process produces contamination, inter alia, in the form of residual slurry particles, residual polishing particles, and residual dielectric particles. The residual slurry particles are abrasive aluminum oxide particles left by the slurry. The residual polishing particles are aluminum oxide particles originating from metal layer 40 which remain after the polishing action. While both types of residual particles are aluminum oxide, they differ in terms of structure and type (e.g., particle size and mechanical properties). The residual dielectric particles are formed if the planarization process removes part of dielectric layer 30. The residual particles are generally loose and unattached to the planarized surface, at most tending to adhere to the interface between the aluminum and silicon oxide layers, and are not chemically bonded.

The residual particles remaining after the planarization process are then substantially removed by a cleaning process. Preferably, the cleaning process reduces the amount of residual particles to the level present before the planarization process and does not increase the particle defect density on the planarized surface. The cleaning process is preferably compatible with the materials exposed on the planarized surface, i.e., dielectric layer 30, metal liner 44, and metal layer 40, and does not degrade these materials.

The cleaning process is preferably performed by washing IC device 10 in a bath containing a cleaning solution while preferably imparting vibrational energy to the bath. The cleaning solution contains water, and preferably contains deionized (DI) water. The vibrational energy may be acoustical energy imparted to the bath through the walls, such as by using a megasonic hood. The vibrating bath removes the loose residual particles, and other residual particles if present, from the planarized surface.

Other additives may be added to the cleaning solution. These additives aid in decreasing corrosion of metal layer 40 by the water, help remove residual particles from the planarized surface of IC device 10, and/or otherwise aid in the cleaning process. These additives include corrosion-inhibiting agents, chelating agents, buffers, oxidants, antioxidants, surfactants, and the like.

Corrosion-inhibiting agents are added because of their ability to reduce or inhibit the corrosion caused by the water. Water, even the cleanest DI water, contains enough hydronium and dissolved gases to corrode metal layer 40. Such corrosion can be increased by charge localization due to interfacial boundaries, grain boundaries, or contact with metals of differing galvanic potentials. Avoiding corrosion is especially important when metal layer 40 forms at least one interlayer connector, or damascene interconnect, as depicted in FIG. 3, since the corrosion can cause a loss of connectivity and a loss of yield.

Any suitable corrosion-inhibiting agent may be used, such as propylene glycol, citric acid, malic acid, tartaric acid, or a salt of these acids. Preferably, citric acid or a salt thereof is employed as the corrosion-inhibiting agent. More preferably, tetramethyl ammonium dihydrate citrate is employed as the corrosion-inhibiting agent. Citric acid or a citric acid salt is added in the form of a solution, preferably about a 5% solution to about a 20% solution, and more preferably a 10% citric acid solution. Generally, when the cleaning solution contains about 5 liters DI water, preferably about 1 to about 1000 ml of such a citric acid solution is added, and more preferably about 500 ml is added. The amounts of water and citric acid solution, however, can vary depending on the type of equipment used in the cleaning process. For example, in a scrubber, polisher, or offload station, the cleaning solution may contain about 20 liters DI water and about 190 ml of a 10% citric acid solution. For a megasonic tank, the cleaning solution may contain about 20 liters DI water and about 1900 ml of a 10% citric acid solution.

Chelating agents are added because of their ability of the agents to chelate, or combine with the residual particles to form a chemical compound. These additives increase the capacity of the cleaning solution to retain metals in solution and remove the residual particles from the vicinity of the planarized surface. Suitable chelating agents include the following organic acids and their salts: ethylenediaminetetraacetic acid (EDTA); butylenediaminetetraacetic acid; cyclohexane-1,2-diaminetetraacetic acid; diethylenetriaminepentaacetic acid; ethylenediaminetetrapropionic acid; (hydroxyethyl) ethylenediaminetriacetic acid (HEDTA); methyliminodiacetic acid; propylenediaminetetraacetic acid; nitrolotriacetic acid (NTA); citric acid; tarric acid; gluconic acid; saccharic acid; glyceric acid; oxalic acid; phthalic acid; maleic acid; mandelic acid; malonic acid; lactic acid; salicylic acid; catechol; 8-hydroxquinoline; N,N,N',N'-ethylenediaminetetra(methylenephosphoric) acid; and mixtures thereof. Citric acid, EDTA, and their salts are the preferred chelating agents. Citric acid and citric acid salts act as chelating agents for residual alumina particles. EDTA and its salts acts as chelating agents for residual metal ions. Citric acid and/or the citric acid salt is added in the same amounts indicated above. EDTA and/or the EDTA salt is added in the form of a solution, preferably about a 1% solution to about a 10% solution, and more preferably a 5% EDTA solution. Generally, when the cleaning solution contains about 5 liters DI water, preferably about 1 to about 100 ml of such a EDTA acid solution is added, and more preferably about 50 ml is added. The amounts of water and EDTA, EDTA salt, citric acid, and/or citric acid salt solutions, however, can vary depending on the type of equipment used in the cleaning process.

Buffers may also be added to the cleaning solution. Buffers are added to control the pH, which is a measure of the acidity of the cleaning solution. If the pH of the solution becomes too high or too low, the cleaning ability of the solution is impaired and the passivating ability, or ability of the solution to maintain an environment which protects the exposed metal or aluminum structures, is hindered. The type and amount of buffer added should keep the pH of the cleaning solution from about 4 to about 8, and more preferably from about 5 to about 6. Buffers that can be employed in the present invention include chemicals containing carbon dioxide such as carbonic acid, ammonium hydroxide, potassium hydroxide, tetramethylammoniumhydroxide (TMAH), and similar basic solutions, or a mixture thereof. Preferably, TMAH is employed as the buffer. TMAH has the added ability of helping to disperse any residual silica particles resulting from the planarization of the preferred silicon oxide dielectric layer 30. TMAH is added in the form of a solution, preferably about a 5% solution to about a 30% solution, and more preferably a 25% TMAH solution. Generally, when the cleaning solution contains about 5 liters DI water, preferably about 1 to about 1000 ml of such a TMAH solution is added, and more preferably about 125 ml is added. The amounts of water and TMAH solution, however, can vary depending on the type of equipment used in the cleaning process. For example, in a scrubber, polisher, or offload station, the cleaning solution may contain about 20 liters DI water and about 190 ml of a 25%TMAH solution. For a megasonic tank, the cleaning solution may contain about 20 liters DI water and about 1900 ml of a 25%TMAH solution.

Oxidants may also be added to the cleaning solution or applied to the polished wafer directly after polishing and before subsequent cleaning steps. Preferably, the oxidant(s) is applied to the polished wafer directly after polishing and before subsequent cleaning steps. Oxidants help the cleaning solution maintain the passivative environment which protects the exposed metal or aluminum structures. In particular, when aluminum surfaces are exposed to water, the oxidants create and preserve a thin continuous layer of hydrated aluminum oxide at the aluminum-water interface. Oxidants that may be added to the cleaning solution include ozone, hydrogen peroxide, peroxy salts, ammonium persulfate, and the like, or mixtures thereof. Preferably, ozone is used as the oxidant. A DI water solution containing about 1 to about 20 ppm ozone, preferably about 10 ppm, may be employed on the polisher during a final polish rinse step which may last about 30 seconds.

Anti-oxidants may also be added to the cleaning solution. Anti-oxidants modify the electrolytic environment of the cleaning solution and serve as a sacrificial oxide. Being a sacrificial oxide, these additives are oxidized instead of the exposed aluminum structures because they have a higher oxide potential than aluminum. Anti-oxidants that may be employed in the present invention include organic anti-oxidants, ascorbic acid, erythorbic acid, and the like, or mixtures thereof. Preferably, ascorbic acid or a slat thereof is used as the anti-oxidant. Ascorbic acid or ascorbic acid salt is added in the form of a solution, preferably about a 1% solution to about a 10% solution, and more preferably a 5% solution. Generally, when the cleaning solution contains about 5 liters DI water, preferably about 1 to about 100 ml of such an ascorbic acid solution is added, and more preferably about 50 ml is added. The amounts of water and ascorbic acid or ascorbic acid salt solution, however, can vary depending on the type of equipment used in the cleaning process.

The cleaning solution of this invention may also contain at least one suitable surfactant. The surfactant helps disperse the residual particles, making them easier to remove. Surfactants useful in the cleaning solution of the present invention include betaines and sulfobetaines such as alkyl betaines, amidoalkyl betaines, alkyl sulfobetaines, and amidoalkyl sulfobetaines; aminocarboxylic acid derivatives such as amphoglycinates, amphorpropionates, amphodiglycinates, and amphodipropiones; amine oxides such as alkyl amine oxides and alkylamido alkylamine oxides; fluroalkyl sulfonates and fluorinated alkyl amphoterics; and mixtures thereof.

The effectiveness of this cleaning solution in removing such residual particles depends on the composition of the solution as discussed above, as well as the temperature and the duration of the contact between the polished surface and the cleaning solution. The temperature of the solution can range from about 10° C. to about 30° C., and is preferably about 21° C. minutes. The length of the solution's contact could range from about 15 seconds to about 60 minutes, and preferably about 5 minutes.

Any suitable means or apparatus may be used to carry out this cleaning process. For example, the cleaning process could be carried out by immersing IC device 10 in a bath containing the cleaning solution. The cleaning process could also be carried out by using spray processing tools common in the industry. This cleaning process could also be carried out by employing the cleaning solution in an appropriate cleaning station built into a wafer polishing tool.

The inventive cleaning process results in polished metal layer 40 with fewer residual particles and less corrosion. When metal layer 40 is the preferred aluminum-containing layer, the amount of residual particles remaining near the surface of the layer ranges from greater than 0 to about 200, and is preferably less than about 50, and the amount of corrosion of the layer ranges from 0 to about 1%. More preferably, there is no visual amount of corrosion when metal layer 40 is inspected at a 150× magnification.

Optionally, an additional cleaning step can next be performed to etch residual alumina particles that have not been removed by the above process. This additional cleaning step contacts an acid solution comprising acetic or phosphoric acid with polished metal layer 40. Preferably, this acid solution comprises phosphoric acid. The preferred acid solution can be prepared by using about 5 ml to about 50 ml of a 50% to 85% phosphoric acid solution per 1000 ml of desired final solution.

The present invention can be illustrated by the following Example, which should not be viewed as limiting the present invention in any manner.

EXAMPLE 1

After depositing a TEOS dielectric layer on an aluminum/copper metal layer, vias are formed in the dielectric layer. A 300 angstrom titanium layer and a 6500 angstrom 99.5% aluminum/0.5% copper layer are sequentially deposited by physical vapor deposition. The resulting structure is then planarized by chemical-mechanical planarization using a slurry containing alumina abrasive particles and an ammonium persulfate oxidizer. A 30 second rinse is performed using deionized water containing 10 ppm ozone.

Next, an offload staging clean is performed using a 0.1% citric acid/0.07% TMAH/deionized water solution. A two-minute cleaning step in a process tank containing 1% phosphoric acid solution at 21° C. is then performed. This latter cleaning step is followed by two successive dump rinses using deionized water containing 100 ppm carbon dioxide.

Next, a five minute megasonic cleaning step is performed at 0.8–1.2 MHZ/500–1000 W using a 0.1% citric acid/0.07% TMAH/deionized water solution. This cleaning step is followed by two successive dump rinses using deionized water containing 100 ppm carbon dioxide.

An ontrak scrub with two brush stations (double-sided) having PVA brushes using a 0.1% citric acid/0.07% TMAH/deionized water solution is performed for 40 seconds per brush station. This scrub is followed by an 18 second spin rinse using deionized water containing 100 ppm carbon dioxide and then a 15 second spin dry.

EXAMPLE 2

After depositing a TEOS dielectric layer on an aluminum/copper metal layer, vias are formed in the dielectric layer. A 300 angstrom titanium layer and a 6500 angstrom 99.5% aluminum/0.5% copper layer are sequentially deposited by physical vapor deposition. The resulting structure is then planarized by chemical-mechanical planarization using a slurry containing alumina abrasive particles and an ammonium persulfate oxidizer. A 30 second rinse is performed using deionized water containing 10 ppm ozone.

A 60 second spin-clean using a 1% phosphoric acid solution in a megasonic hood and then a 60 second spin-clean with a 1% citric acid/0.7% TMAH solution in a megasonic hood are then performed in the same spin-cleaning station. Then a 60 second PVA brush scrub using a 0.1% citric acid/0.07% TMAH solution is performed. Finally, a spin-rinse is performed with deionized water containing 100 ppm carbon dioxide and then a spin-dry is performed.

While the preferred embodiments of the present invention have been described above, the invention defined by the appended claims is not to be limited by particular details set forth in the above description, as many apparent variations thereof are possible without departing from the spirit or scope thereof.

What is claimed is:

1. A metallization structure for an integrated circuit, comprising:

an integrated circuit substrate; and an aluminum-containing conductive layer overlying the integrated circuit substrate and including a polished surface finish exhibiting no visible corrosion up to at least 150× magnification.

2. The metallization structure of claim 1, wherein the integrated circuit substrate comprises an upper metal surface.

3. The metallization structure of claim 2, including a dielectric layer disposed between the integrated circuit substrate and the aluminum-containing layer.

4. The metallization structure of claim 3, wherein the dielectric layer contains at least one via therein.

5. The metallization structure of claim 4, wherein the at least one via exposes the upper metal surface of the integrated circuit substrate.

6. The metallization structure of claim 5, including at least one titanium-containing layer disposed between the aluminum-containing layer and the upper metal surface of the integrated circuit substrate and between the aluminum-containing layer and a sidewall of the at least one via.

7. The metallization structure of claim 6, wherein the at least one titanium-containing layer comprises a layer of titanium underlying a layer of titanium nitride.

8. The metallization structure of claim 7, wherein an aluminum concentration of the aluminum-containing layer is at least 50 wt %.

9. The metallization structure of claim 5, wherein an aluminum concentration of the aluminum-containing layer ranges from 60 wt % to 90 wt %.

10. A metallization structure for an integrated circuit, comprising:

a substrate including an upper metal surface;

a polished aluminum-containing layer overlying the substrate and exhibiting no visual corrosion up to at least 150× magnification, the aluminum-containing layer including an aluminum concentration ranging from 60 wt % to 90 wt %; and a dielectric layer disposed between the substrate and the aluminum-containing layer, the dielectric layer containing at least one via therein, the at least one via exposing the upper metal surface of the substrate.

11. A metallization structure for an integrated circuit, comprising:

a substrate including an upper metal surface;

a dielectric layer disposed over the substrate, the dielectric layer containing at least one via therein, the at least one via exposing the upper metal surface of the substrate; and an aluminum-containing layer overlying the substrate and the dielectric layer including a polished surface finish exhibiting no visible corrosion up to at least 150× magnification.

12. The metallization structure of claim 11, including at least one titanium-containing layer disposed between the aluminum-containing layer and the upper metal surface of the substrate and between the aluminum-containing layer and a sidewall of the at least one via.

13. The metallization structure of claim 12, wherein the at least one titanium-containing layer comprises a layer of titanium underlying a layer of titanium nitride.

14. The metallization structure of claim 13, wherein an aluminum concentration of the aluminum-containing layer is at least 50 wt %.

* * * * *

UNITED STATES PATENT AND TRADEMARK OFFICE
CERTIFICATE OF CORRECTION

PATENT NO. : 6,265,781 B1
DATED : July 24, 2001
INVENTOR(S) : Michael T. Andreas It is certified that error appears in the above-identified patent and that said Letters Patent is hereby corrected as shown below:

Column 4,
Line 6, change "(IEOS)" to -- (TEOS) --

Column 6,
Line 13, change "tarris" to -- tartaric --

Column 7,
Line 43, change "fluroalkyl" to -- fluoroalkyl --
Line 51, after "21º C." delete "minutes"

Column 9,
Lines 20, 35 and 38, after "-containing" and before "'layer" insert -- conductive --
Line 30, after "containing" and before "layer" insert -- conductive --

Signed and Sealed this

Twenty-first Day of September, 2004

JON W. DUDAS
*Director of the United States Patent and Trademark Office*